(12) United States Patent
Wu et al.

(10) Patent No.: US 9,899,234 B2
(45) Date of Patent: Feb. 20, 2018

(54) LINER AND BARRIER APPLICATIONS FOR SUBTRACTIVE METAL INTEGRATION

(71) Applicant: Lam Research Corporation, Fremont, CA (US)

(72) Inventors: Hui-Jung Wu, Pleasanton, CA (US); Thomas Joseph Knisley, Beaverton, OR (US); Nagraj Shankar, Tualatin, OR (US); Meihua Shen, Fremont, CA (US); John Hoang, Fremont, CA (US); Prithu Sharma, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 248 days.

(21) Appl. No.: 14/320,245

(22) Filed: Jun. 30, 2014

(65) Prior Publication Data

US 2015/0380272 A1    Dec. 31, 2015

(51) Int. Cl.
*H01L 21/768* (2006.01)
*H01L 21/3213* (2006.01)
(Continued)

(52) U.S. Cl.
CPC .... *H01L 21/32136* (2013.01); *C23C 16/0245* (2013.01); *C23C 16/0272* (2013.01); *C23C 16/045* (2013.01); *C23C 16/16* (2013.01); *C23C 16/54* (2013.01); *H01J 37/32357* (2013.01); *H01L 21/02126* (2013.01); *H01L 21/02274* (2013.01); *H01L 21/32138* (2013.01); *H01L 21/76834* (2013.01); *H01L 21/76852* (2013.01); *H01L 21/76885* (2013.01); *H01L 23/53238* (2013.01); *H01J 2237/332* (2013.01);
(Continued)

(58) Field of Classification Search
None
See application file for complete search history.

(56) References Cited

U.S. PATENT DOCUMENTS 5,110,760 A   5/1992  Hsu
5,695,810 A  12/1997  Dubin et al.
(Continued)

FOREIGN PATENT DOCUMENTS

CN        101246846 A      8/2008
KR     10-1999-0016355      3/1999
(Continued)

OTHER PUBLICATIONS

U.S. Appl. No. 12/044,918, filed Mar. 7, 2008, entitled "Selective Capping of Copper with Ruthenium."
(Continued)

*Primary Examiner* — Jack Chen
(74) *Attorney, Agent, or Firm* — Weaver Austin Villeneuve & Sampson LLP

(57) ABSTRACT

Methods and techniques for fabricating metal interconnects, lines, or vias by subtractive etching and liner deposition methods are provided. Methods involve depositing a blanket copper layer, removing regions of the blanket copper layer to form a pattern, treating the patterned metal, depositing a copper-dielectric interface material such that the copper-dielectric interface material adheres only to the patterned copper, depositing a dielectric barrier layer on the substrate, and depositing a dielectric bulk layer on the substrate.

17 Claims, 11 Drawing Sheets

(51) Int. Cl.
  *H01J 37/32* (2006.01)
  *H01L 23/532* (2006.01)
  *C23C 16/02* (2006.01)
  *C23C 16/04* (2006.01)
  *C23C 16/16* (2006.01)
  *C23C 16/54* (2006.01)
  *H01L 21/02* (2006.01)

(52) U.S. Cl.
  CPC ..... *H01J 2237/334* (2013.01); *H01L 21/7682* (2013.01); *H01L 2924/0002* (2013.01)

(56) References Cited

U.S. PATENT DOCUMENTS

| | | | |
|---|---|---|---|
| 6,153,519 | A | 11/2000 | Jain et al. |
| 6,323,120 | B1 | 11/2001 | Fujikawa et al. |
| 6,323,131 | B1 | 11/2001 | Obeng et al. |
| 6,340,633 | B1 | 1/2002 | Lopatin et al. |
| 6,342,733 | B1 | 1/2002 | Hu et al. |
| 6,410,442 | B1* | 6/2002 | Yang ............... C23F 1/18 216/105 |
| 6,451,682 | B1 | 9/2002 | Fujikawa et al. |
| 6,753,248 | B1 | 6/2004 | Wood et al. |
| 6,838,375 | B2 | 1/2005 | Hu |
| 6,844,258 | B1 | 1/2005 | Fair et al. |
| 6,858,534 | B2 | 2/2005 | Mouli |
| 6,899,816 | B2 | 5/2005 | Padhi et al. |
| 6,943,105 | B2 | 9/2005 | Joshi |
| 7,157,798 | B1 | 1/2007 | Fair et al. |
| 7,244,677 | B2 | 7/2007 | Ritzdorf et al. |
| 7,256,466 | B2 | 8/2007 | Lieber et al. |
| 7,259,061 | B2 | 8/2007 | Kundalgurki |
| 7,429,532 | B2 | 9/2008 | Ramaswamy et al. |
| 7,432,192 | B2 | 10/2008 | Feng et al. |
| 7,589,017 | B2 | 9/2009 | Chan et al. |
| 7,732,922 | B2 | 6/2010 | Yang et al. |
| 7,741,226 | B2 | 6/2010 | Andry et al. |
| 7,843,063 | B2 | 11/2010 | Baker-O'Neal et al. |
| 7,858,510 | B1 | 12/2010 | Banerji et al. |
| 7,994,558 | B2 | 8/2011 | Lim et al. |
| 7,994,640 | B1 | 8/2011 | Alers et al. |
| 8,022,548 | B2 | 9/2011 | Oladeji et al. |
| 8,039,379 | B1 | 10/2011 | Alers et al. |
| 8,053,365 | B2 | 11/2011 | Humayun et al. |
| 8,119,527 | B1 | 2/2012 | Chandrashekar et al. |
| 8,129,270 | B1 | 3/2012 | Chandrashekar et al. |
| 8,278,216 | B1 | 10/2012 | Alers et al. |
| 8,586,473 | B1 | 11/2013 | Tanwar et al. |
| 8,617,982 | B2* | 12/2013 | Danek ............ H01L 21/28562 257/774 |
| 8,623,733 | B2 | 1/2014 | Chen et al. |
| 8,623,758 | B1 | 1/2014 | Ryan et al. |
| 9,153,482 | B2 | 10/2015 | Knisley et al. |
| 9,349,637 | B2 | 5/2016 | Na et al. |
| 9,748,137 | B2 | 8/2017 | Lai et al. |
| 2002/0037644 | A1 | 3/2002 | Rha et al. |
| 2002/0096768 | A1 | 7/2002 | Joshi |
| 2003/0022487 | A1 | 1/2003 | Yoon et al. |
| 2003/0082587 | A1 | 5/2003 | Seul et al. |
| 2004/0105934 | A1 | 6/2004 | Chang et al. |
| 2004/0127001 | A1 | 7/2004 | Colburn et al. |
| 2004/0175631 | A1 | 9/2004 | Crocker et al. |
| 2005/0119725 | A1 | 6/2005 | Wang et al. |
| 2005/0129843 | A1 | 6/2005 | Wu et al. |
| 2006/0108320 | A1 | 5/2006 | Lazovsky et al. |
| 2006/0113675 | A1 | 6/2006 | Chang et al. |
| 2006/0118921 | A1 | 6/2006 | Lin et al. |
| 2006/0189113 | A1 | 8/2006 | Vanheusden et al. |
| 2006/0254503 | A1 | 11/2006 | Dai et al. |
| 2006/0254504 | A1 | 11/2006 | Dai et al. |
| 2006/0292846 | A1 | 12/2006 | Pinto et al. |
| 2007/0134420 | A1 | 6/2007 | Koberstein et al. |
| 2007/0166989 | A1 | 7/2007 | Fresco et al. |
| 2008/0067679 | A1 | 3/2008 | Takagi et al. |
| 2008/0200027 | A1 | 8/2008 | Cho |
| 2009/0053426 | A1 | 2/2009 | Lu et al. |
| 2009/0269507 | A1* | 10/2009 | Yu ................... H01L 21/02074 427/535 |
| 2010/0144140 | A1 | 6/2010 | Chandrashekar et al. |
| 2011/0111533 | A1 | 5/2011 | Varadarajan et al. |
| 2012/0009785 | A1 | 1/2012 | Chandrashekar et al. |
| 2012/0080793 | A1 | 4/2012 | Danek et al. |
| 2012/0177845 | A1 | 7/2012 | Odedra et al. |
| 2013/0260555 | A1 | 10/2013 | Zope et al. |
| 2014/0106083 | A1 | 4/2014 | Wu et al. |
| 2015/0221542 | A1 | 8/2015 | Knisley et al. |
| 2016/0056074 | A1 | 2/2016 | Na et al. |
| 2016/0056077 | A1 | 2/2016 | Lai et al. |

FOREIGN PATENT DOCUMENTS

| | | |
|---|---|---|
| KR | 10-0304962 | 10/2001 |
| WO | WO 2006/124769 | 11/2006 |
| WO | WO 2012/047913 | 4/2012 |

OTHER PUBLICATIONS

U.S. Appl. No. 11/772,773, filed Jul. 2, 2007, entitled "Nanoparticle Cap Layer."

Knisley et al., "Methods and Apparatus for Selective Deposition of Cobalt in Semiconductor Processing," U.S. Appl. No. 14/171,483, filed Feb. 3, 2014.

U.S. Office Action, dated Aug. 26, 2008, issued in U.S. Appl. No. 11/506,761.

U.S. Office Action, dated Feb. 24, 2009, issued in U.S. Appl. No. 11/506,761.

U.S. Final Office Action, dated Jan. 6, 2010, issued in U.S. Appl. No. 11/506,761.

U.S. Final Office Action, dated Apr. 8, 2010, issued in U.S. Appl. No. 11/506,761.

U.S. Office Action, dated Apr. 19, 2011, issued in U.S. Appl. No. 11/506,761.

U.S. Office Action, dated Oct. 14, 2011, issued in U.S. Appl. No. 11/506,761.

U.S. Notice of Allowance, dated Mar. 28, 2012, issued in U.S. Appl. No. 11/506,761.

U.S. Office Action, dated Jun. 22, 2009, issued in U.S. Appl. No. 12/044,918.

U.S. Final Office Action, dated Jan. 25, 2010, issued in U.S. Appl. No. 12/044,918.

U.S. Office Action, dated Sep. 22, 2010, issued in U.S. Appl. No. 11/772,767.

U.S. Final Office Action, dated Apr. 12, 2011, issued in U.S. Appl. No. 11/772,767.

U.S. Notice of Allowance dated Jun. 27, 2011, issued in U.S. Appl. No. 11/772,767.

U.S. Office Action, dated Sep. 29, 2010, issued in U.S. Appl. No. 11/772,773.

U.S. Office Action, dated Jan. 11, 2011, issued in U.S. Appl. No. 11/772,773.

U.S. Final Office Action, dated Jul. 26, 2011, issued in U.S. Appl. No. 11/772,773.

U.S. Office Action, dated Aug. 28, 2009, issued in U.S. Appl. No. 11/772,784.

U.S. Final Office Action, dated Feb. 23, 2010, issued in U.S. Appl. No. 11/772,784.

U.S. Notice of Allowance, dated Dec. 28, 2010, issued in U.S. Appl. No. 11/772,784.

U.S. Notice of Allowance, dated Apr. 11, 2011, issued in U.S. Appl. No. 11/772,784.

U.S. Notice of Allowance, dated Aug. 26, 2013, issued in U.S. Appl. No. 13/251,446.

PCT International Search Report and Written Opinion, dated Apr. 19, 2012, issued in PCT/US2011/054798.

PCT International Preliminary Report on Patentability and Written Opinion, dated Apr. 18, 2013, issued in PCT/US2011/054798.

(56) References Cited

OTHER PUBLICATIONS

Korean First Office Action dated Feb. 5, 2014 issued in KR 2013-7011476.
Aloha, Air Liquide Electronics, "RuEtCp2," Aloha™ CVD/ALD Materials, 2 pages.
Becker et al. (2003) "Highly Conformal Thin Films of Tungsten Nitride Prepared by Atomic Layer Deposition from a Novel Precursor," Chem. Mater,15(15):2969-2976.
Becker et al. (Apr. 7, 2003) "Diffusion barrier properties of tungsten nitride films grown by atomic layer deposition from bis(tert-butylimido)bis(dimethylamido) tungsten and ammonia," Applied Physics Letters, 82(14):2239-2241.
Cao, L.F. et al. (2006) "Thermal stability of Fe, Co, Ni metal nanoparticles," phys. Stat. sol. (b) 243(12):2745-2755.
Chen, Shaowei et al. (1999) "Electrochemical Quantized Capacitance Charging of Surface Ensembles of Gold Nanoparticles," J. Phys. Chem. B, 103(45):9996-10000.
Chen, Wei et al. (2006) "Carbene-Functionalized Ruthenium Nanoparticles," Chem. Mater, 18:5253-5259.
Cheng, Guangjun et al. (Dec. 20, 2005) "Magnetic-Field-Induced Assemblies of Cobalt Nanoparticles," Langmuir The ACS Journal of Surfaces and Colloids, American Chemical Society, 21(26):12055-12059.
Chirea, M. et al. (2005) "Electrochemical Characterization of Polyelectrolyte/Gold Nanoparticle Multilayers Self-Assembled on Gold Electrodes," J. Phys. Chem. B, 109(46):21808-21817.
Chiu et al. (Jun. 1993) "Tungsten nitride thin films prepared by MOCVD," J. Mater. Res., 8(6):1353-1360.
Crane et al. (2001) "Kinetic and Mechanistic Studies of the Chemical Vapor Deposition of Tungsten Nitride from Bis(Tertbutylimido)Bis(Tertbutylamido) Tungsten," J. Phys. Chem. B, 105(17):3549-3556.
Gladfelter, Wayne L. (1993) "Selective Metallization by Chemical Vapor Deposition," Chem. Mater, 5(10):1372-1388.
Hu, C.K. et al. (Jun. 14, 2004) "Atom motion of Cu and Co in Cu damascene lines with a CoWP cap," Applied Physics Letters, American Institute of Physics, 84(24):4986-4988.
Kakuhara, et. al.,(2010) "Comparison of Lifetime Improvements in Electromigration between Ti Barrier Metal and Chemical Vapor Deposition Co Capping," Japanese Journal of Applied Physics, 49:04DB08, 1-5 pages.
Kim et al. (2003) "Characteristics of Tungsten Carbide Films Prepared by Plasma-Assisted ALD Using Bis(tert-butylimido)bis(dimethylamido) tungsten," Journal of the Electrochemical Society, 150(10):C740-C744.
Kwon, Oh-Kyum et al. (2004) "PEALD of a Ruthenium Adhesion Layer for Copper Interconnects," Journal of the Electrochemical Society, 151(12):C753-C756.
Lee, Don Keun et al. (2006) "Preparation of monodisperse Co and Fe nanoparticle using precursor of M2+-oleate2 (M = Co, Fe)," Current Applied Physics 6:786-790.
Nogami et al., (2010) "CVD Co and its Application to Cu Damascene Interconnections," Proceedings of the IITC, IEEE, 3 pages.
Parod-Yissar, V. et al. (2001) "Layered Polyelectrolyte Films on Au Electrodes: Characterization of Electron-Transfer Features at the Charged Polymer Interface and Application for Selective Redox Reactions," American Chemical Society, Langmuir 2001, 17(4):1110-1118.
Simon et al., (2013) "Electromigration Comparison of Selective CVD Cobalt Capping with PVD Ta(N) and CVD Cobalt Liners on 22nm-Groundrule Dual-Damascene Cu Interconnects," Reliability Physics Symposium (IRPS), IEEE International, p. 3F.4.1-3F.4.6; 6 pages.
Tsai, et al. (Mar. 4, 1996) "Metalorganic chemical vapor deposition of tungsten nitride for advanced metallization," Appl. Phys. Lett. 68(10):1412-1414.
Wu et al. (Sep./Oct. 2003) "Surface reaction of bis(tertbutylimido) bis(diethylamido)tungsten precursor on Si(100)-(2X1)," J. Vac. Sci. Technol. A 21(5):1620-1624.
Yang, et al., (Jul. 2010) "Characterization of Selectively Deposited Cobalt Capping Layers: Selectivity and Electromigration Resistance", IEEE Electron Device Letters, 31(7):728-730.
Yang et al., (2011) "CVD Co Capping Layers for Cu/Low-k Interconnects: Cu EM enhancement vs. Co thickness," International Interconnect Technology Conference (IITC), IEEE International, 3 pages.
Zimmermann, C.G. et al. (Aug. 9, 1999) "Burrowing of Co Nanoparticles on Clean Cu and Ag Surfaces," Physical Review Letters, The American Physical Society, 83(6):1163-1166.
Chinese First Office Action dated Jul. 29, 2014 issued in CN 201180048438.1.
Hesemann et al., (2000) "The Effect of Film Thickness on Stress and Transformation Behavior in Cobalt Thin Films," *Mat. Res. Soc. Symp. Proc.*, 594:219-224.
Chinese Second Office Action dated Apr. 10, 2015 issued in CN 201180048438.1.
U.S. Appl. No. 15/492,976, filed Apr. 20, 2017, Na et al.
Chinese First Office Action dated Jun. 19, 2017 issued in CN 201510374339.2.

* cited by examiner

LINER AND BARRIER APPLICATIONS FOR SUBTRACTIVE METAL INTEGRATION

BACKGROUND

Fabrication of effective metal interconnects, lines, and vias is critical to the manufacture of semiconductor devices. The damascene process has been the dominant integrated circuit fabrication technology employed to form copper interconnects. However, conventional damascene methods may not be suitable for advanced technology nodes beyond 22 nm due to the smaller critical dimension features to be fabricated in semiconductor devices.

SUMMARY

Provided are methods of fabricating metal interconnects, lines, or vias by subtractive etching and liner deposition methods. One aspect involves a method of processing a semiconductor substrate by performing subtractive etching on a blanket copper layer to form a pattern of features, treating the patterned copper to reduce the copper surface, and depositing a dielectric layer on the substrate.

In many embodiments, the pattern includes features, and the size of grains formed by depositing the blanket copper layer are on average greater than a dimension of the features formed by the subtractive etching. In many embodiments, lines in the pattern have an aspect ratio between about 5:1 and about 1:1.

In various embodiments, the method further includes prior to performing subtractive etching, depositing one or more underlayers on the substrate, such that the blanket copper layer is deposited on one or more underlayers. In many embodiments, the one of the one or more underlayers includes tantalum and/or tantalum nitride. In various embodiments, performing the subtractive etching further includes removing regions of the blanket copper layer to form the features.

In various embodiments, the patterned copper is treated by exposing the copper to a reducing agent, such as hydrogen ($H_2$), ammonia ($NH_3$), or hydrogen/nitrogen ($H_2/N_2$). In many embodiments, treating the patterned copper repairs the surface of the copper. In various embodiments, the patterned copper is exposed to UV light. In various embodiments, remote plasma or in-situ plasma is used to enhance the copper surface repair. In some embodiments, the patterned copper is treated and exposed to UV light concurrently. The treatment may occur for a time between about 1 second and about 300 seconds. The temperature during treatment may be between about 100° C. and about 400° C., or between about 200° C. and about 400° C.

In many embodiments, depositing the dielectric layer includes depositing a dielectric barrier layer. In some embodiments, the dielectric barrier layer includes a high-k material, such that k is greater than or equal to 3, or such that k is greater than or equal to 4. In some embodiments, the dielectric barrier layer is deposited to a thickness less than about 3 nm. In various embodiments, the dielectric layer is deposited to leave air gaps.

In some embodiments, the method includes performing subtractive etching on a blanket copper layer to form a pattern of features, treating the patterned copper to reduce the copper surface, selectively depositing a copper-dielectric interface material on the patterned copper, and depositing a dielectric layer on the substrate. In some embodiments, the blanket copper layer is subtractively etched using a photoresist as a patterned mask. In various embodiments, the copper-dielectric interface material is cobalt deposited by chemical vapor deposition or atomic layer deposition. In many embodiments, the adhesion energy of the copper-dielectric interface material relative to copper is at least about 5 $J/m^2$, or at least about 10 $J/m^2$. In some embodiments, the copper-dielectric interface material is deposited to a thickness less than about 30 Å, or about 20 Å. In some embodiments, the method also includes anisotropically etching the dielectric layer. The dielectric layer may be a dielectric barrier or liner layer, or a dielectric bulk layer.

In some embodiments, the method includes etching the dielectric layer to form at least one dielectric spacer, such that the dielectric spacers include material selected from the group consisting of aluminum oxide, SiOC, SiNC, and silicon oxide.

Another aspect involves a method of forming metal interconnects on a semiconductor substrate by performing subtractive etching on a blanket layer of metal to form a pattern of features; treating the patterned metal; selectively depositing a metal-dielectric interface layer on the metal; and depositing a dielectric layer on the substrate. In many embodiments, the depositing the dielectric layer includes depositing a dielectric barrier layer. In some embodiments, the metal is subtractively etched using a photoresist as a patterned mask.

Another aspect involves an apparatus configured to process a semiconductor substrate, including (a) a deposition chamber which includes a showerhead, a substrate support, and one or more gas inlets; and (b) a controller for controlling the operations in the apparatus, including machine readable instructions for introducing etching reactants to the deposition chamber to subtractively etch a blanket copper layer on the substrate to form a pattern of features; introducing treatment reactants to the deposition chamber to reduce the copper surface; introducing a first set of precursors to selectively deposit a copper-dielectric interface material on the patterned copper; and introducing a second set of precursors to deposit a dielectric layer on the substrate. In some embodiments, the controller includes instructions for subtractively etching the blanket copper layer by depositing a photoresist, patterning the photoresist, and etching the copper using the photoresist as a mask.

These and other aspects are described further below with reference to the drawings.

BRIEF DESCRIPTION OF THE DRAWINGS

FIGS. 8A-11A and 8B-11B are schematic illustrations of a substrate in accordance with disclosed embodiments.

DETAILED DESCRIPTION

Figure 1:
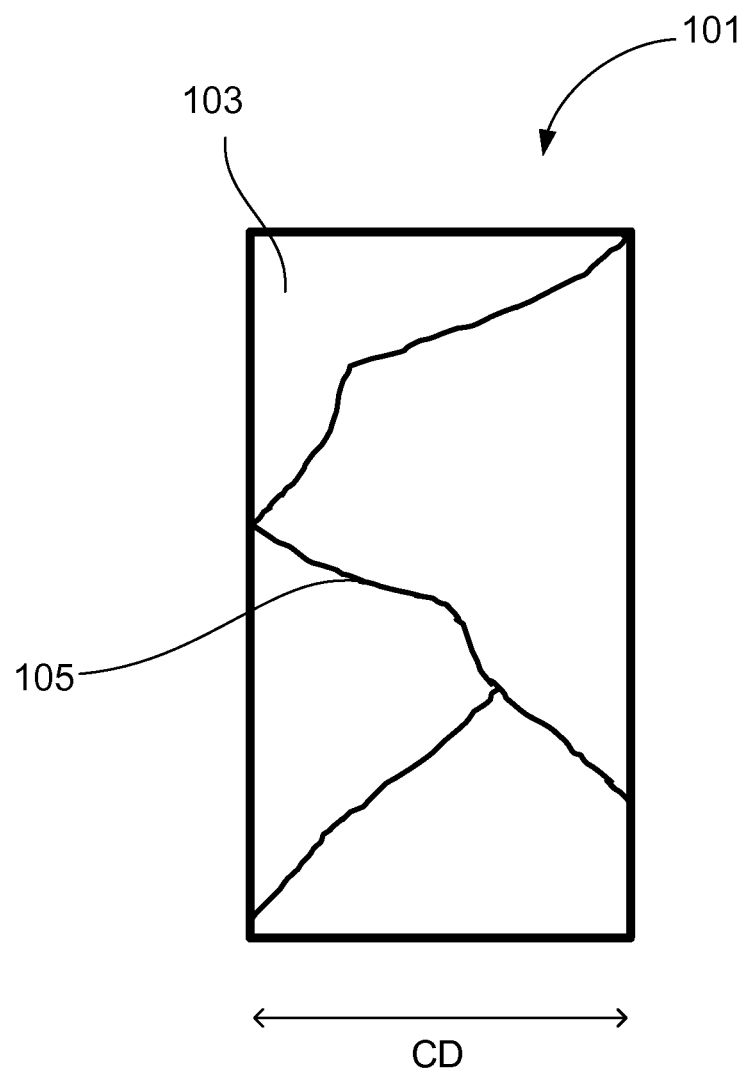
FIG. 1 is a schematic drawing of metal grains grown in a line.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

The terms "semiconductor wafer," "wafer," "substrate," "wafer substrate," and "partially fabricated integrated circuit" are used interchangeably. "Partially fabricated integrated circuit" can refer to a silicon or other semiconductor wafer during any of many stages of integrated circuit fabrication thereon. A substrate used in the semiconductor device industry typically has a diameter of 200 mm or 300 mm, though the industry is moving towards the adoption of 450 mm diameter substrates. The flow rates and conditions provided herein are appropriate for processing on 300 mm substrates. One of ordinary skill in the art would appreciate that these flows may be adjusted as necessary for substrates of other sizes. Power levels and flow rates generally scale linearly with the number of stations and substrate area. The flow rates and powers may be represented on a per area basis. In addition to reaction chambers used to deposit films on semiconductor substrates, other types of deposition reactors may take advantage of the disclosed embodiments. Other types of reactors that may benefit from the disclosed embodiments include those used to fabricate various articles such as printed circuit boards, displays, and the like.

Semiconductor processing often involves fabrication of metal interconnects, such as copper vias and lines. The conventional method for fabricating copper interconnects is the damascene process. The damascene process typically involves the following generalized steps: (1) depositing a dielectric layer on a substrate, (2) etching the dielectric layer to form trenches or vias, (3) optionally depositing a barrier layer into the trenches or vias, and (4) filling the trenches or vias with metal such as copper. Example barrier layers include tantalum/tantalum nitride (Ta/TaN). In some damascene processes, a dielectric etch stop layer is then deposited over the substrate to passivate the metal vias. In an example damascene process, copper may be deposited into vias or trenches of a dielectric layer on a substrate by the damascene process, and after the copper vias are formed, a subsequent dielectric layer, such as silicon carbonitride (SiCN), is deposited on the dielectric layer.

Although the industry has used the damascene process for many years, the damascene process may not be optimal for fabricating metal interconnects for technology nodes 22 nm and beyond. As devices shrink, features become smaller, aspect ratios increase, and the trenches and vias in which metal must be deposited become narrower. In a conventional damascene process, metal is filled in trenches by a method such as copper electroplating (or electro Cu plating), and metal growth begins on the surfaces in the trench. As a result, the metal grains formed in the resulting metal feature are limited in size by the relatively small dimensions of the trench. Since smaller metal grains generally have higher resistivity, metal interconnects formed by a damascene process in these smaller critical dimension trenches have higher resistivity, and thus are less effective than desired.

FIG. 1 depicts a cross-section of a trench of a metal deposited by a conventional conformal deposition process. The trench 101 is filled with metal 103 having grain boundaries 105. The critical dimension (CD) of the trench 101 is fairly narrow. As a consequence, their growth is limited to a size that is approximately the half of the width of trench 101.

The conductivity of metal is determined in some measure by the grain size of the metal deposited. Deposited metal having larger grain sizes is more conductive. This is because electrons traveling through the metal scatter every time they encounter a grain boundary. Electrons scattering during transport reduces the conductivity of the material.

Another concern in the fabrication of metal interconnects is the effect of electromigration and potential interface void formation as a result of electromigration. Electromigration occurs at the interface between the metal and adjacent dielectric layer when a current runs through the semiconductor device and travelling electrons force metal atoms at the interface between the metal and dielectric to move. These metal atoms move from one end of the line towards the other, thereby forming a small aggregation of metal atoms at one end of the line, and forming a void where the electromigration began. These voids can result in electromigration failure.

A further concern in the fabrication of metal interconnects is the effect of metal diffusion. Where a metal line is adjacent to a dielectric, metal ions may diffuse into the dielectric, thereby reducing the reliability of the dielectric.

Yet another concern in metal interconnect fabrication is the adhesion between the metal interconnect and all other adjacent layers. In standard interconnects, the bottom of a metal interconnect is adjacent to a barrier layer which was deposited on the substrate prior to forming the interconnect. This barrier layer is often a metal liner. However, the top surface of the metal interconnect is often adjacent to dielectric layers, and the adhesion energy of a metal-dielectric interface is lower than that of a metal-metal interface. High adhesion energy at the metal-dielectric interface is important to ensure longer device lifetime such that the strong force at the interface prevents metal atoms from migrating while a current is run, thereby minimizing electromigration.

Selective cap deposition methods have been used on metal interconnects formed by the damascene process to improve the adhesion and to reduce electromigration void formation near the metal-dielectric interface at the top surface of the metal interconnect. A description of selective capping of copper metal is described in U.S. Pat. No. 8,278,216, titled "SELECTIVE CAPPING OF COPPER," which is herein incorporated by reference in its entirety. In selective cap deposition, a selective material is deposited after the trench is filled with metal by electro copper plating. The selective material deposits on only the metal part of the substrate surface such that it is selective to the metal and forms a cap over the metal line, with no selective material deposited on the surface of the dielectric. For example, cobalt may be deposited on a copper line such that a thin cobalt cap is formed on the top surface of the copper line. The selective cap forms an interface with the metal, such that the adhesion energy of the metal-metal interface is higher than that of a metal-dielectric interface. However, smaller grains of metal are still present in the line, resulting in less conductive interconnects, and the grain boundary can also lead to void formation through grain boundary diffusion. Thus, it is desirable to fabricate metal interconnects with large, low-resistivity grains, reduced electromigration, reduced void formation, and improved adhesion.

Provided herein are methods for fabricating low resistivity metal interconnects with reduced electromigration and improved adhesion. The methods involve treatment of patterned metal formed by subtractive etch and deposition of layers over the patterned metal. Resulting metal interconnects exhibit lower resistivity due to the larger grains formed by deposition of a blanket metal layer, reduced electromigration failure due to deposition of layers at the metal-dielectric interface, and improved interface integrity. The methods described herein help reduce leakage between metal lines or vias, protect the metal-dielectric interface, and prevent metal diffusion between lines or vias. The use of the term "lines" in the disclosed embodiments refers to one example of the type of integrated circuit fabrication that may result from the methods described herein. Although lines are described in the subsequent discussion, the disclosed embodiments may be applicable to other types of features, such as interconnects, vias, and contacts. In lines and contacts, the width may refer to the shortest distance across from one side of the line or contact to the other. A "dimension" as used herein may refer to a distance from one side of a feature to the other. The following disclosure uses the term "copper" but one will understand that the disclosed embodiments may be applicable to other metals and other chemistries may be suitable for formation of other metal interconnects.

Figure 2:
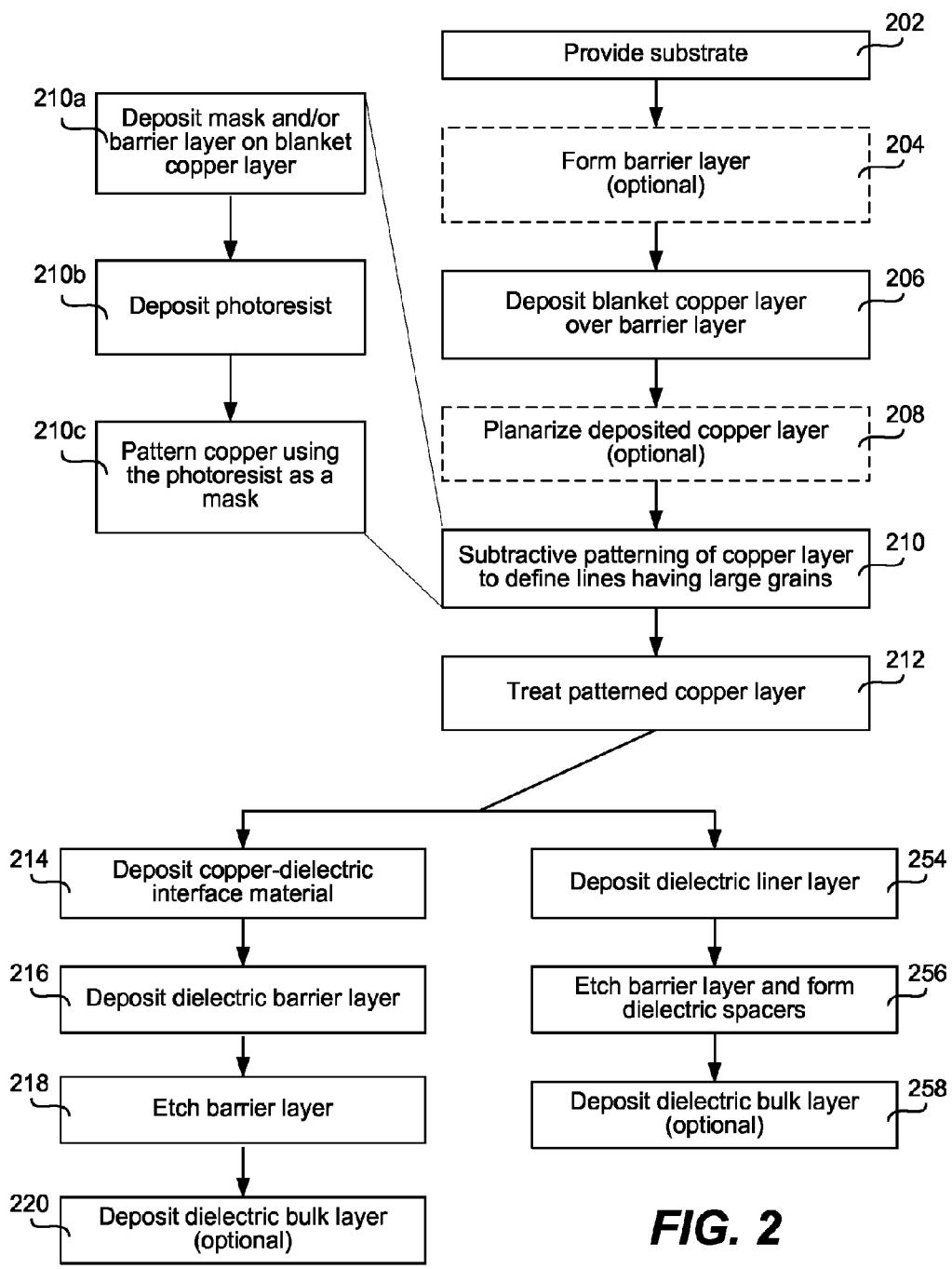
FIG. 2 is a flowchart depicting operations for performing methods in accordance with disclosed embodiments.

FIG. 2 is a flowchart depicting operations of a method described in the disclosed embodiments. In operation 202, a substrate is provided to a process chamber. In many embodiments, the substrate includes a dielectric layer. For example, the substrate may be a partially fabricated integrated circuit on a silicon substrate.

In operation 204, one or more underlayers, such as barrier underlayers, may be optionally formed on the substrate. Barrier underlayers may reduce metal ion diffusion. Thus, in many embodiments, if the metal to be deposited on the substrate is susceptible to diffusion, one or more barrier underlayers may be deposited prior to depositing the metal. Where a subsequent metal to be deposited is not susceptible to ion diffusion, the barrier underlayer deposition in operation 204 may be optional. The following description assumes a barrier layer is present on the substrate. An optional liner (such as tantalum (Ta) or cobalt (Co)) can be deposited between copper and the barrier underlayers to enhance the adhesion and avoid electromigraton failure.

Examples of barrier underlayers include metal nitrides such as tantalum nitride, or metals, such as tantalum. In some embodiments, the barrier underlayer is a Ta/TaN liner. Other example barrier layers include titanium nitride/titanium (TiN/Ti), or tungsten nitride/titanium (WN/Ti). In many embodiments, one or more barrier underlayers are deposited. For example, two barrier underlayers may be deposited where one layer is a tantalum nitride layer and the second layer is a tantalum layer. In some embodiments, the tantalum layer is deposited on top of the tantalum nitride layer. In many embodiments, the barrier underlayers are deposited by physical vapor deposition (PVD), chemical vapor deposition (CVD), or atomic layer deposition (ALD), or pulsed nucleation layer (PNL) deposition. In many embodiments, where the metal to be deposited is copper, a Ta/TaN barrier underlayer is deposited in operation 204.

In a PNL or CVD process, a substrate may be heated to a process temperature in a vacuum chamber, and subsequently, a very thin layer of metal may be deposited on the substrate. Thereafter, the remainder of the metal film is deposited on the very thin layer of metal, such as by electroplating or CVD. In some embodiments, the very thin layer of metal is a seed layer. In general, a seed layer is a thin layer which serves to facilitate the subsequent formation of a bulk material thereon. Various processes may be used to form the seed layer, including but not limited to, CVD processes, ALD processes and PNL deposition processes.

In a PNL technique, pulses of reactants are sequentially injected and purged from the reaction chamber, typically by a pulse of a purge gas between reactants. A first reactant is typically adsorbed onto the substrate, available to react with the next reactant. The process is repeated in a cyclical fashion until the desired thickness is achieved. Thus, PNL is similar to ALD techniques. PNL is generally distinguished from ALD by its higher operating pressure range (greater than 1 Torr) and its higher growth rate per cycle (greater than 1 monolayer film growth per cycle). In the context of the description provided herein, PNL broadly embodies any cyclical process of sequentially adding reactants for reaction on a semiconductor substrate. Thus, the concept embodies techniques conventionally referred to as ALD. In the context of the description provided herein, CVD embodies processes in which reactants are together introduced to a reactor for a vapor-phase reaction. PNL and ALD processes are distinct from CVD processes and vice-versa. Once the seed layer is formed, a metal film is deposited by CVD. In this operation, a reducing agent and a precursor are introduced into a deposition chamber to deposit a bulk layer on the substrate. An inert carrier gas may be used to deliver one or more of the reactant streams, which may or may not be pre-mixed. Unlike PNL or ALD processes, this operation generally involves flowing the reactants continuously until the desired amount is deposited. In certain embodiments, the CVD operation may take place in multiple stages, with multiple periods of continuous and simultaneous flow of reactants separated by periods of one or more reactant flows diverted.

Returning to FIG. 2, in operation 206, a blanket metal layer, such as a blanket copper layer, is deposited to form large copper grains on the substrate, which will subsequently be formed into lines. The copper grains are larger because the grains are not restricted by narrow boundaries, such as the sidewalls of a trench. In some embodiments, the blanket copper layer is deposited to a thickness thicker than the height of the lines to be formed. The blanket copper layer may be deposited by any conventional method, such as copper electroplating (e.g., by electrochemical deposition (ECD)), PVD, CVD, or a combination of PVD followed by ECD. In addition to copper, other blanket metal layers include aluminum and silver.

Deposition of copper by PVD may be performed by sputtering copper onto a substrate for a time less than about 5 minutes, or between about 1 second and about 5 minutes, or less than about 1 minute. Either a planar target or a hollow cathode magnetron (HCM) target may be used as the copper source to deposit blanket copper on the substrate. Copper may be delivered to the substrate using a carrier gas in a volume less than about 100 mL. For example, deposition of copper by PVD may include sputtering copper on a substrate using argon as a carrier gas for a time less than about 1 minute at a temperature between about −40° C. and about 100° C. and a chamber pressure less than about $1 \times 10^{-6}$ Torr.

The blanket copper layer may be deposited by a combination of PVD and ECD. For the PVD component, copper may be sputtered directly on the substrate using argon as a carrier gas at a volume less than about 100 mL. The PVD component may be performed at a temperature between about −40° C. and about 100° C., with a chamber pressure less than about $1 \times 10^{-6}$ Torr. PVD may be performed for less than about 1 minute. An aqueous solution of copper(II) sulfate ($CuSO_4$) may be used for ECD. ECD may be performed at room temperature with a chamber pressure at atmospheric pressure for a time less than about three minutes. A description of copper deposition by ECD is described in U.S. Pat. No. 6,074,544, titled "METHOD OF ELECTROPLATING SEMICONDUCTOR WAFER USING VARIABLE CURRENTS AND MASS TRANSFER TO OBTAIN UNIFORM PLATED LAYER," which is herein incorporated by reference in its entirety.

Returning to FIG. 2, in operation 208, the blanket copper layer may optionally be planarized, such as by chemical mechanical polishing (CMP) or another planarization process.

Figure 3:
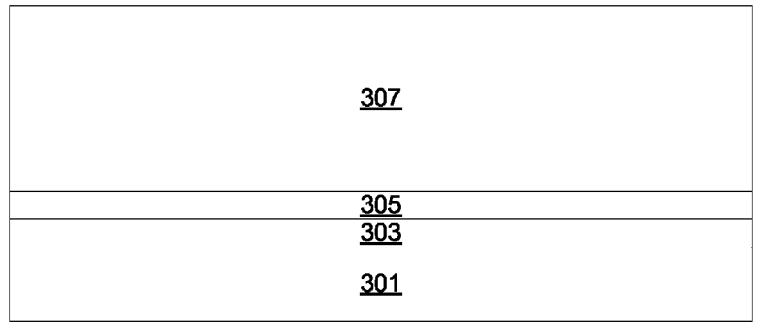
FIGS. 3-6 are schematic illustrations of a substrate in accordance with disclosed embodiments.

FIG. 3 depicts a schematic representation of an example of layers of a substrate deposited using operations 202-208. As shown, barrier underlayers 303 and 305 are deposited on substrate 301, such as described above with respect to operation 204 in FIG. 2. In certain embodiments, barrier underlayer 303 is tantalum nitride, and barrier underlayer 305 is a tantalum metal liner. A blanket copper layer 307 is deposited on top of the barrier underlayer 305, such as described above with respect to operation 206.

Returning to FIG. 2, in operation 210, subtractive etching is performed on the blanket copper layer to define lines having large grains. The subtractive etching in operation 210 may be performed by any appropriate patterning method. An example is provided in operations 210a-210c.

In operation 210a, one or more mask and/or barrier layers are deposited on the blanket copper layer. The barrier layer may be deposited by CVD, PVD, or ALD. In many embodiments, the barrier layer acts as a barrier between the copper and the mask used to subtractively etch the copper. In many embodiments, at least one of the masks deposited is a tantalum/tantalum nitride metal hardmask layer. In various embodiments, a barrier layer such as a thin dielectric barrier may be deposited on the blanket copper layer, a metal mask layer may be deposited on the dielectric barrier, a carbon layer may be deposited on the metal mask, and a SiON or SiOC layer may be deposited on the carbon layer. In some examples, the thin dielectric barrier is a SiN or SiCN layer. In some embodiments, the metal mask is tantalum or tantalum nitride or combinations thereof.

Figure 4:
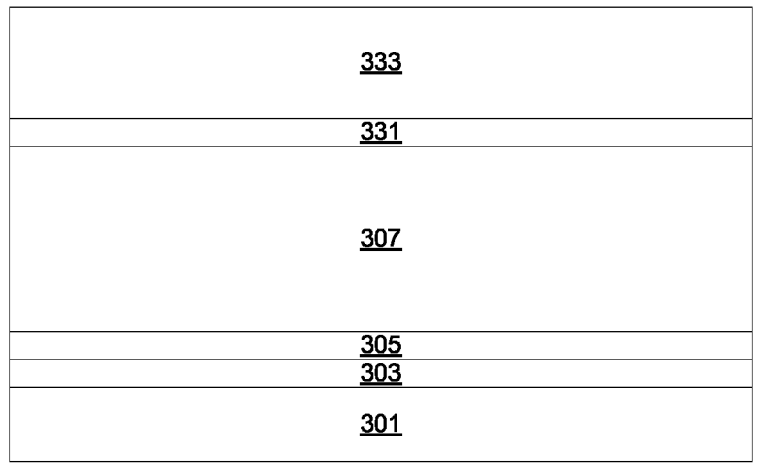
Figure 5:

In operation 210b, a photoresist is deposited on the mask. The photoresist may be an organic film with photoactive sites implanted for the pattern to be made on the blanket copper layer. FIG. 4 depicts a schematic representation of the layers as deposited, such that the barrier or mask layer 331 is on the blanket copper layer 307 and the photoresist 333 is deposited on the barrier or mask layer 331. Note that although FIG. 4 depicts a single barrier or mask layer 331, various barrier layers and mask layers may be present on the substrate. Subsequently, a lithography process may be employed to define the pattern in the photoresist.

For example, a lithography process may be employed to define the locations of the metal in the blanket layer. A conventional lithography process involves depositing a photoresist, focusing light on the photoresist, exposing the photoresist, and removing the exposed or non-exposed regions of the photoresist, depending upon whether the photoresist is a positive or negative photoresist. All the possible variations of lithography are contemplated and the one that is chosen will be suitable for the particular technology node in which the process is implemented. For example, electron beam lithography may be employed in which an electron beam is used in place of focused light to define the pattern. It should be noted that for some technology nodes, such as nodes below 22 nm, it may be appropriate to use an immersion-based photolithography process. For nodes below 10 nm or nodes below 7 nm, it may be appropriate to use extreme ultraviolet lithography.

Returning to FIG. 2, in operation 210c, the blanket copper layer is patterned using the photoresist as a mask. In various embodiments, this operation includes etching and forming the mask, followed by etching the copper using the mask. Etching and forming the mask may include various operations, and may be performed using conventional techniques. In some embodiments, the deposited photoresist is developed and used to pattern a SiON or SiOC layer immediately adjacent to the photoresist. After the photoresist is stripped, the SiON or SiOC pattern is subsequently transferred to an underlying carbon mask. In some embodiments, the carbon mask is then used to etch a barrier metal hard mask, such as a tantalum or tantalum nitride layer deposited on the copper. The tantalum or tantalum nitride metal hard mask may then be used as a mask while the copper is etched.

Returning to FIG. 2, in some embodiments, in operation 210c, the blanket copper layer is patterned by, for example, performing a dry etch. In certain embodiments, the etching may be performed in two stages: a first anisotropic etch which produces slightly oversized lines, followed by an isotropic etch to trim the oversized lines to the appropriate final size. Both of these etches are typically performed using gas phase etchants.

Subtractive etch may be performed using helium, along with other additives. Examples of additives include hydrogen ($H_2$), methane ($CH_4$), neon, argon, or combinations thereof. Hydrogen, neon, or argon, if used as the additive gas, may be flowed into the chamber at a flow rate between about 0 sccm and about 200 sccm or up to 1000 sccm. Methane may be flowed at a flow rate between about 0 sccm and about 50 sccm. Helium may be flowed at a flow rate between about 200 sccm and about 1000 sccm. The chamber pressure may be between about 4 mTorr and about 80 mTorr. The copper may be etched using a plasma with a bias voltage of about 50 to about 300 Vb and TCP power between about 500 W and about 1500 W. Operations 210a-210c may be performed at a temperature between about 60° C. and about 120° C.

Multiple steps may be used for subtractive copper etch. For example, the copper may be exposed to a $CH_4$-based chemistry with or without hydrogen, helium, and/or argon as a carrier gas. Subsequently, the copper may be exposed to helium along with other additives. Multiple cycling of the two steps may be used to improve trench etch depth microloading and line edge roughness.

A detailed description of subtractive etching in the context of tungsten interconnects is described in U.S. Pat. No. 8,617,982, issued on Dec. 31, 2013, titled "SUBTRACTIVE PATTERNING TO DEFINE CIRCUIT COMPONENTS," which is herein incorporated by reference in its entirety.

Figure 6:
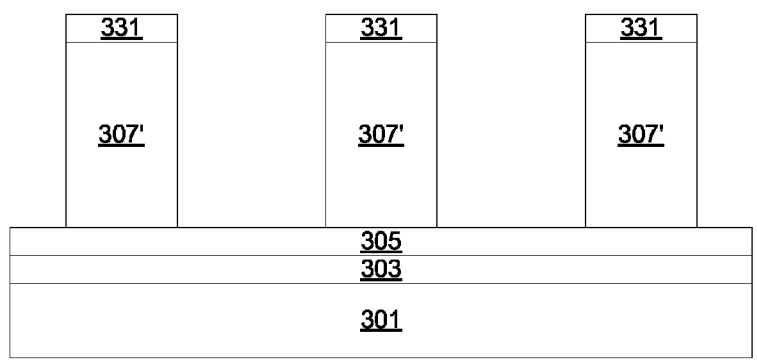

FIG. 6 is a schematic illustration of an example of patterned copper lines formed by subtractive etching described with respect to operation 210. The blanket copper layer 307 was subtractively etched to thereby form patterned copper 307', each of which is sitting on barrier underlayers 303 and 305. In some embodiments, the patterned copper 307' forms copper lines. As shown, the photoresist 333 has also been stripped, leaving a mask or barrier layer 331 on the patterned copper 307'. In some embodiments, mask or barrier layer 331 is also stripped. In various embodiments, lines have an aspect ratio of at least 1:1, at least 2:1, or at least 3:1, or at least 5:1, or at least 10:1. In some embodiments, the lines have an aspect ratio between about 5:1 and about 1:1, or between about 3:1 and about 1:1, or between about 3:1 and about 2:1. In many embodiments, the space between metal lines formed by subtractive etch may be less than about 20 nm in width. For example, patterned copper may have lines formed that are less than about 20 nm apart from one another. In various embodiments, the width of a line produced by subtractive etch may not be greater than about 25 nm, or not greater than about 15 nm. For many applications, the via or line width is between about 10 nm and about 20 nm. It should be understood that devices having lines or vias made by subtractive etch may have a range or distribution of via/line widths and/or aspect ratios. Of course, devices such as memory devices may have many or all vias of the same size and/or aspect ratio.

Figure 7:
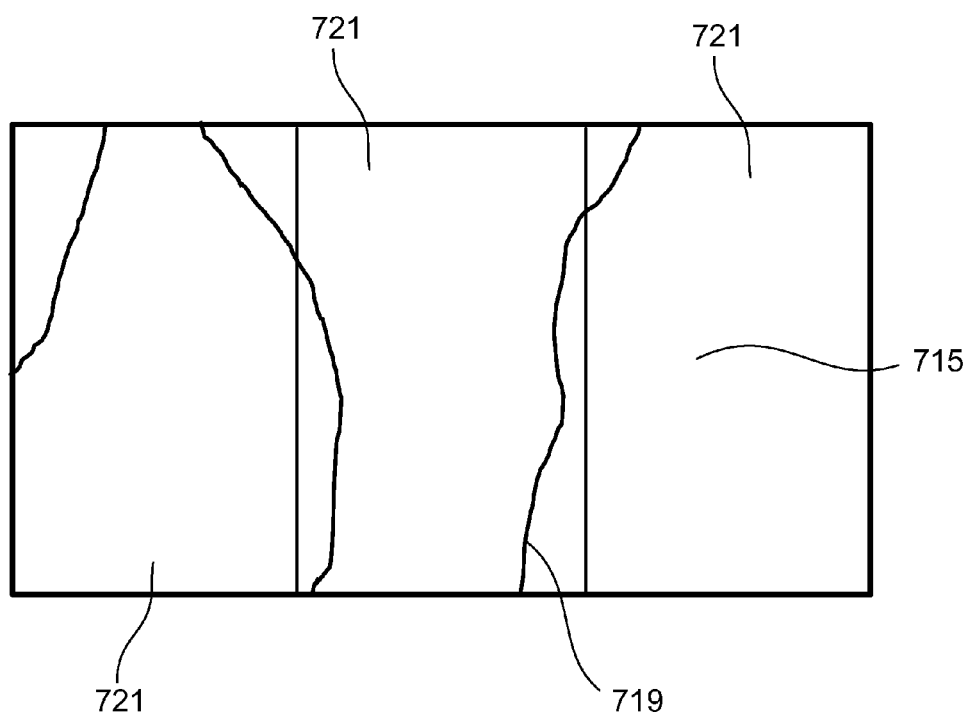
FIG. 7 is a schematic illustration of a line with grains in accordance with disclosed embodiments.

FIG. 7 is a schematic illustration of an example of the grains 721 formed in the blanket layer 715 that ultimately become the grains 721 in the line 719. The metal has substantially the same morphology as that of the deposited blanket layer 715. Grains 721 of the metal as deposited remain substantially intact in the resulting line 719. The as-deposited metal layer has a series of large grains 721 which, as noted, may have a size approximately equal to the line height. As shown in FIG. 1, conventional electroplated copper fill has a much higher resistivity than copper deposited as a blanket layer and then subtractively patterned to form copper lines. In various embodiments, the grains formed during operation 206 may have a width up to about 200 nm, or up to ten times the width of the space between lines.

Accordingly, the height of the grains is, on average, a significant fraction of the line height. Often, the grain size is substantially the same as the line height, as shown in FIG. 7. As a consequence, the metal lines are significantly more conductive than that of damascene metal. In some embodiments, the average size of the grains in the blanket film is significantly greater than the lateral size of the lines. In this case, subtractive etch results in the lines on average being filled with part of a single metal grain—effectively producing a single crystal metal fill. However, this is not necessary to realize the benefits of subtractive etch. In some embodiments, the grain size is relatively small in comparison to line dimensions.

Returning to FIG. 2, in operation 212, the patterned copper is treated to reduce the copper surface. In some embodiments, prior to treatment, the substrate with patterned copper may be optionally heated in an atmosphere of an inert gas, such as helium. For example, the substrate may be heated at a temperature between about 30° C. and about 250° C. for a time between about 1 second and about 600 seconds. The substrate may be heated uniformly.

In various embodiments, after the substrate is optionally heated, the patterned copper is treated. In some embodiments, the treatment may be performed thermally, with UV, with plasma (remote or in-situ), or any combination thereof. In some embodiments, the copper is treated by exposing the surface to a process gas. In many embodiments, the treatment reduces and potentially repairs the copper surface. The treatment improves adhesion energy and provides a better surface for subsequent deposition. For patterned copper lines, treatment is particularly important to improve adhesion energy between copper and an adjacent layer, and also provides a more uniform and adhesive surface for subsequent layer deposition. In various embodiments, the process gas is a reducing agent such as hydrogen ($H_2$), or ammonia ($NH_3$). In some embodiments, the process gas is a mixture of hydrogen and nitrogen ($H_2/N_2$). The process gases may include an inert gas, such as helium.

The treatment of the patterned copper on the substrate may include concurrent irradiation with UV light. The UV light may have a wavelength between about 190 nm and about 450 nm. In some embodiments, the substrate is exposed to hydrogen and helium while irradiated with UV light for a time between about 1 second and about 300 seconds. In some embodiments, the patterned copper is exposed to UV light before or after treatment with a process gas.

The treatment may be performed at a temperature between about 100° C. and about 400° C., or between about 200° C. and about 400° C. In some embodiments, the substrate is treated at a temperature of about 350° C. The treatment may be performed at a chamber pressure between about 0.2 Torr and about 50 Torr. In various embodiments, the treatment is performed without the presence of a plasma.

In various embodiments, the treatment is performed with the presence of a plasma. The treatment of the patterned copper on the substrate may include exposure to either remote plasma or in-situ plasma. The plasma source can enhance the effectiveness of the copper reduction or repair the copper surface. The power and frequency supplied may be sufficient to generate a plasma from process gases supplied to the process chamber. In a process using a radio frequency (RF) dual frequency plasma, the high frequency (HF) RF component may generally be between 5 MHz to 60 MHz, e.g., 13.56 MHz. In operations where there is a low frequency (LF) component, the LF component may be from about 100 kHz to 5 MHz, or 100 kHz to 2 MHz, e.g., 430 kHz. Ranges of plasma power may be, for example, between about 50 W and 2500 W for HF power and between about 0 W and 2500 W for LF power for 300 mm substrates in a 4-station tool. Plasma power per substrate area for HF power may be between about 0.018 W/cm$^2$ and about 0.884 W/cm$^2$ and power per substrate area for LF power may be between about 0 W/cm$^2$ and about 0.884 W/cm$^2$.

After operation 212, in some embodiments, operation 214 may be performed while in other embodiments, operation 254 may be performed. In operation 214, a copper-dielectric interface material, which may be a selective glue liner, or selective glue layer, is deposited on the substrate such that the copper-dielectric interface material only adheres to the surfaces of the patterned copper. Since the copper was subtractively etched, the copper-dielectric interface material may also adhere to the side surfaces in addition to the top surfaces of the patterned copper. In embodiments where the mask or barrier layer on the patterned copper is not removed, the copper-dielectric interface material may adhere to the side surfaces. The copper-dielectric interface material essentially seals the copper surfaces to prevent electromigration near the surfaces of the patterned copper that may be exposed to dielectric material if the copper-dielectric interface material is not deposited, thereby improving the copper-dielectric interface. The copper-dielectric interface material may be deposited by CVD, ALD, or PVD. In many embodiments, the copper-dielectric interface material is deposited at a temperature between about 100° C. and about 400° C., or between about 200° C. and about 400° C., and a pressure between about 0.01 Torr and about 10 Torr.

For example, a cobalt may be deposited as a copper-dielectric interface material on patterned copper by introducing a cobalt-containing precursor and a carrier gas in a CVD process at a temperature between about 150° C. and about 350° C., and a pressure between about 0.5 Torr and about 20 Torr. Examples of cobalt precursors include but are not limited to: dicobalt hexacarbonyl tert-butylacetylene (CCTBA), dicarbonyl cyclopentadienyl cobalt(I), cobalt carbonyl, and various cobalt amidinate precursors. Examples of carrier gases include argon, helium, and nitrogen. In some embodiments, CCTBA is introduced at a flow rate of between about 0.5 sccm and about 20 sccm.

Figure 8A:
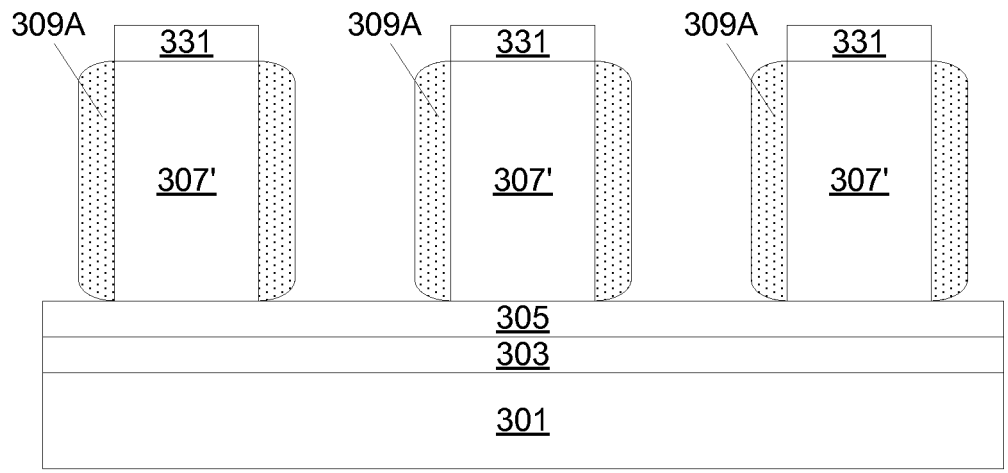

FIG. 8A provides a schematic illustration of a copper-dielectric interface material 309A deposited over patterned copper 307' which sits on barrier underlayers 303 and 305 on substrate 301. In the embodiment depicted, the mask or barrier layer 331 has not been removed, so the copper-dielectric interface material 309A is deposited on the sidewalls of the patterned copper 307'. The copper-dielectric interface material 309A may be deposited to a thickness less than about 30 Å or between about 10 Å and about 20 Å. In some embodiments, the copper-dielectric interface material 309A is deposited to a thickness less than about 15 Å. It is noted that the thicknesses of layers shown in FIG. 8A are not drawn to scale and the copper-dielectric interface material 309A is depicted to more clearly show the selective nature of the copper-dielectric interface material 309A. The copper-dielectric interface material 309A may have a step coverage of at least about 80% or about 100%, thereby forming a continuous layer around the entire exposed surfaces of the patterned copper. In many embodiments, the copper-dielectric interface material 309A is selective such that it deposits onto the surface of the patterned copper 307' but may not deposit onto the surface of the barrier underlayers 305 or 303, or on the surfaces of the mask or barrier layer 331. In some embodiments, some copper-dielectric interface material 309A may deposit onto the exposed side surface of barrier underlayer 305 or 303, but the functionality and effectiveness of the overall interconnect may not be affected. For example, if cobalt is deposited on patterned copper as a copper-dielectric interface material, and the patterned copper is on a tantalum barrier underlayer, and some cobalt is deposited on the exposed side surface of the tantalum barrier underlayer, the effectiveness of the cobalt is not affected because tantalum may not diffuse.

An advantage of depositing a copper-dielectric interface material is that it may not deposit on the exposed surface of the dielectric or barrier layers below. If a copper-dielectric interface material were to be deposited on the dielectric, the copper-dielectric interface material may cause a short circuit. Thus, even though a copper-dielectric interface material may be a metal, its selectivity to deposit almost exclusively on the patterned copper provides the advantage of not having to remove copper-dielectric interface material deposited on the exposed dielectric surface.

In some embodiments, the copper-dielectric interface material may be selective to metal generally. In some embodiments, the copper-dielectric interface material may be selective to copper. The chemistry selected to deposit the copper-dielectric interface material may depend on the chemistry of the underlying metal vias. For example, a suitable copper-dielectric interface material to deposit on patterned copper is cobalt.

The copper-dielectric interface has high adhesion energy. Adhesion energy is defined as the energy sufficient for one layer of film to pull off or break off from an adhered adjacent layer of film. Adhesion energy may be measured in Joules per square meter. For many metal-dielectric interfaces, the adhesion energy is about 10 $J/m^2$. In many embodiments, the adhesion energy of the copper-dielectric interface may be greater than about 5 $J/m^2$, or greater than about 10 $J/m^2$. Although the copper-dielectric interface material may reduce electromigration at the copper-dielectric interface, copper diffusion may still occur through the copper-dielectric interface material into the dielectric, thereby rendering the dielectric less reliable. Thus, a dielectric barrier layer may subsequently be deposited over the copper-dielectric interface material, as described below.

Referring back to FIG. 2, in operation 216, a dielectric barrier layer is deposited over the copper-dielectric interface material. The dielectric barrier layer may be deposited such that it forms a thin conformal layer over the patterned copper and also contacts a dielectric layer or barrier underlayer between the patterned copper. The dielectric barrier layer may be deposited by CVD, ALD, or conformal film deposition (CFD). Precursors used for the deposition process depend on the chemistry of the dielectric barrier layer to be deposited. For example, for a SiOC dielectric barrier layer, suitable precursors include tetramethyl silane, and trimethyl silane. Deposition may be at a process temperature between about 200° C. and about 400° C. and at a pressure between about 0.1 Torr and about 5 Torr. A carrier gas may also be flowed during deposition. Example carrier gases include helium, carbon dioxide ($CO_2$), argon, and nitrogen. In some embodiments, the precursor (e.g., tetramethyl silane) and carrier gas (e.g., $CO_2$) are introduced sequentially. For a continuous flow, the precursor such as tetramethyl silane and carrier gas (e.g., $CO_2$) are deposited at flow rates between about 50 sccm and about 500 sccm, and between about 2000 sccm and about 5000 sccm, respectively. In various embodiments, deposition of the dielectric barrier layer may be thermal (e.g., without plasma).

Figure 9A:
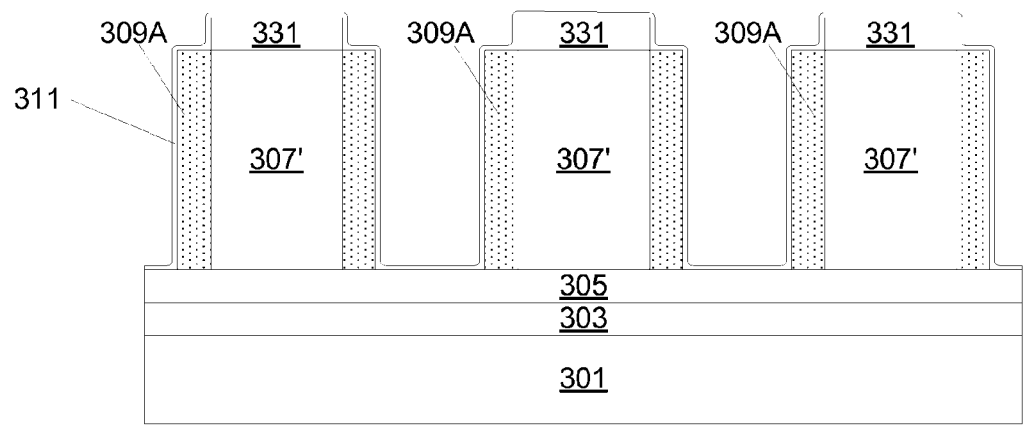

FIG. 9A is a schematic representation of a dielectric barrier layer 311 deposited over the mask 331 (which, in some embodiments, may not be present) and the copper-dielectric interface material 309A. The copper-dielectric interface material 309A is capped over the surfaces of the patterned copper 307', which sit on top of barrier underlayers 305 and 303, all on substrate 301. The dielectric barrier layer 311 may include any high-k dielectric chemistry. For example, the dielectric barrier layer 311 may include SiCN, SiON, AlN, or SiOC. In some embodiments, the dielectric barrier layer 311 is an aluminum oxide or silicon oxide layer. In various embodiments, the dielectric barrier layer 311 may have a k value greater than or equal to 4. In some embodiments, the dielectric barrier layer 311 is selective. In various embodiments, the dielectric barrier layer 311 is not selective. The dielectric barrier layer 311 protects the metal from oxidation and also prevents copper diffusion of copper lines. In certain embodiments, a dielectric barrier layer 311 of SiCN is deposited on top of the copper-dielectric interface material 309 of cobalt, which lines the surfaces of the patterned copper 307'. In many embodiments, the dielectric barrier layer 311 is less than about 3 nm, for example about 2 nm. In various embodiments, the dielectric barrier layer has at least 80% step coverage, or about 100% step coverage.

Figure 10A:
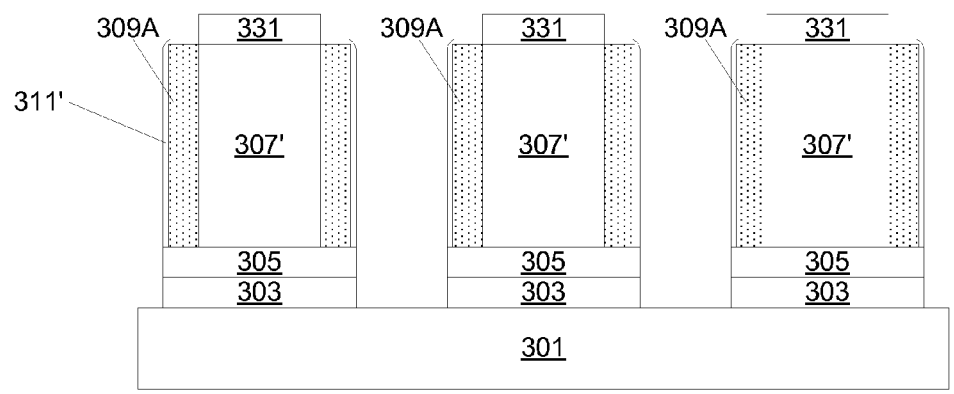

Returning to FIG. 2, in operation 218, the dielectric barrier and barrier underlayer are etched anisotropically such that the horizontal surfaces of the dielectric barrier layer and the barrier underlayer are removed down to the dielectric substrate. Any conventional anisotropic etch method may be used, such as reactive ion etching. FIG. 10A is a schematic representation of the etched underlayers 303 and 305. Note the horizontal portions of the dielectric barrier layer 311 have been removed from both the mask 331 and the barrier underlayers 305 and 303 to form dielectric spacers 311' while the substrate 301 is now exposed.

Returning to FIG. 2, in operation 220, a dielectric bulk layer is subsequently optionally deposited over the substrate. The dielectric bulk layer may be deposited by CVD, ALD, CFD, or spin-on methods. In many embodiments, the bulk layer is a low-k dielectric. For example, the dielectric bulk layer may be a spin-on organic polymer. In many embodiments, after the dielectric bulk layer is deposited, CMP may be performed on the substrate.

Figure 11A:
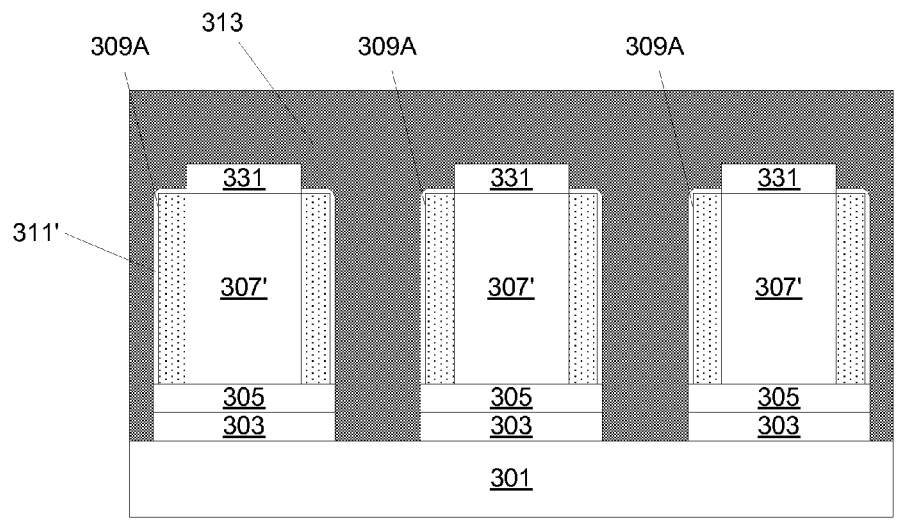

The dielectric deposition can be performed according to any suitable technique, including any of several known processes including CVD, ALD, and CFD-based processes. Suitable examples are described, for example, in U.S. Pat. Nos. 6,596,654; 7,629,227; 8,557,712; and application Ser. No. 14/074,596, the disclosures of which relating to dielectric deposition techniques are incorporated by reference herein. In some embodiments, the dielectric bulk layer is deposited so as to fill the spaces between the metal lines. FIG. 11A is a schematic representation of a substrate 301 where the dielectric bulk layer 313 is deposited over the dielectric spacers 311' so as to fill the gaps between the patterned copper 307', which are selectively capped with a copper-dielectric interface material 309A.

In some embodiments, the dielectric bulk layer is deposited so as to intentionally leave air gaps between the metal lines while having less than about 90% step coverage over the dielectric barrier layer. Without being bound by a particular theory, it is believed that air gaps between metal lines reduce the capacitance of the dielectric bulk layer to improve efficiency.

Figure 11B:
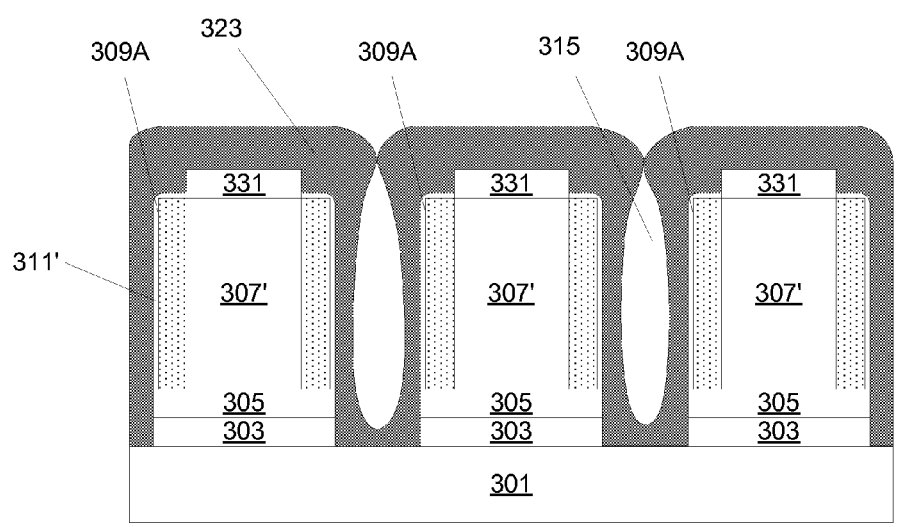

FIG. 11B is a schematic representation of a substrate 301 where the dielectric bulk layer 323 is deposited over the dielectric spacers 311' with air gaps 315 between the patterned copper 307', which are selectively capped with a copper-dielectric interface material 309A. Note that in some embodiments, dielectric bulk layer 323 may still be deposited on some surfaces of the dielectric spacers 311', but the step coverage may be less than about 90%.

Figure 8B:
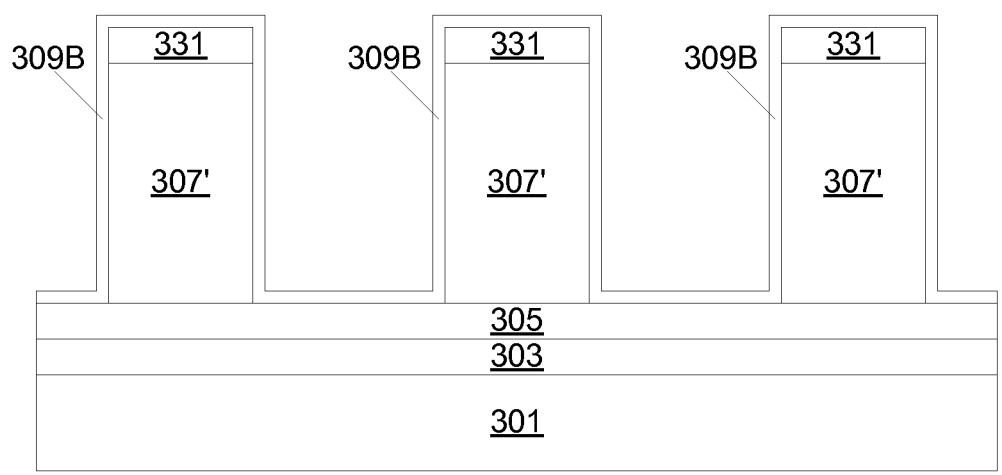

Returning to FIG. 2, alternatively, after the patterned copper is treated in operation 212, a dielectric liner layer may be deposited in operation 254. The dielectric liner layer may be any suitable dielectric as listed above. The dielectric liner layer may have a thickness similar to that of the barrier underlayers but is deposited conformally over the substrate using CVD or ALD methods. The material of the dielectric liner layer may include aluminum oxide or silicon oxide or any combination thereof. FIG. 8B is a schematic illustration of an example of a dielectric liner layer 309B deposited conformally over the patterned copper 307' and the mask 331. In some embodiments, the mask 331 has been removed prior to depositing the dielectric liner layer 309B.

Returning to FIG. 2, in operation 256, the barrier underlayer is etched and the dielectric liner is anisotropically etched to form dielectric spacers. Hydrogen and halogen chemistry such as $CF_4$, $NF_3$, or $CHF_3$, may be used to open the liner and barrier and recess into the low-k dielectric. The hydrogen and halogen chemistry may be flowed to the chamber at a flow rate between about 0 sccm and about 500 sccm. Carrier gases may include helium, neon, or argon. Argon and neon may be flowed at a flow rate between about 0 sccm and about 500 sccm and helium may be flowed at a flow rate between about 0 sccm and 1000 sccm. In some embodiments, nitrogen is used at a flow rate between about 0 sccm and about 200 sccm. The chamber pressure may be between about 2 mTorr and about 80 mTorr. The halogen may be activated by plasma having a TCP power between about 200 W and about 1500 W with a bias voltage between about 20 Volts and about 400 Volts. The liner open with barrier open and low-k recess may be performed at a temperature between 20° C. and about 120° C. During liner open, the copper may be protected by the dielectric barrier layer previously deposited on the patterned copper. Using a halogen chemistry, the barrier may then be etched to recess into the dielectric using various processes.

Figure 9B:

FIG. 9B is a schematic illustration of the exposed substrate 301 with horizontal portions of the barrier underlayers 303 and 305 removed, as well as the horizontal portions of the dielectric liner layer 309B on the mask 331 removed to form dielectric spacers 309B'. In some embodiments where the mask 331 is not present, the top surface of the patterned copper 307' may be exposed.

Figure 10B:
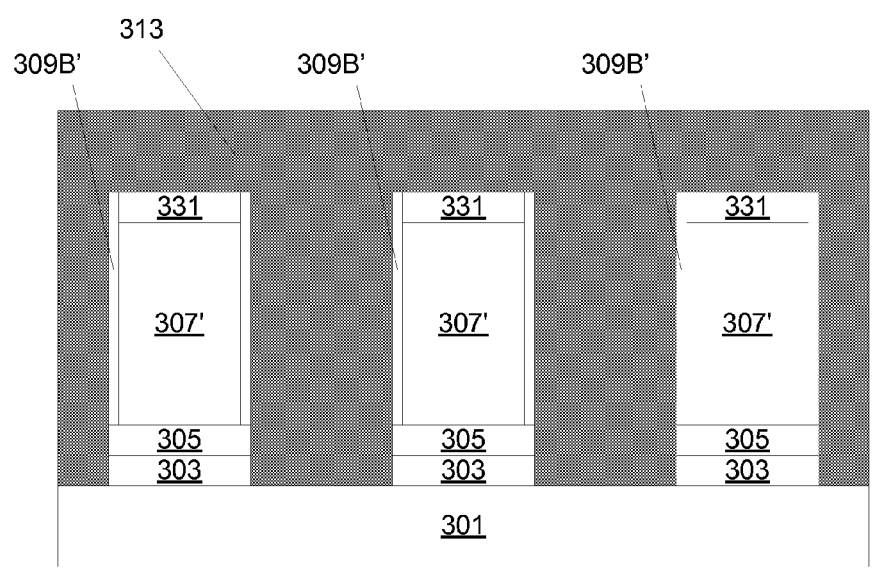

In operation 258, a dielectric bulk layer is subsequently optionally deposited over the substrate. The conditions for the dielectric bulk layer deposition may be any of those discussed above with respect to operation 220. FIG. 10B is a schematic illustration of dielectric bulk layer 313 deposited over the substrate.

Apparatus

The methods herein may be carried out in various types of deposition apparatuses available from various vendors. Examples of a suitable apparatus include SABRE™ electrochemical deposition (ECD) products, Vector (PECVD) products, a Concept-1 Altus™, a Concept 2 Altus™, a Concept-2 Altus-S™, Concept 3 Altus™ deposition system, and Altus Max™ from Lam Research Corp. of Fremont, Calif., or any of a variety of other commercially available ECD, CVD, and/or PVD tools. In some cases, a PNL/CVD process can be performed on multiple deposition stations sequentially.

In some embodiments, a copper-dielectric interface material is deposited, e.g., by CVD. For example, a cobalt glue layer may be deposited on patterned copper by CVD in a first station that is one of two, five, or even more deposition stations positioned within a single deposition chamber. Alternatively, the first station may be used to treat the patterned copper on the substrate. In some embodiments, the copper-dielectric interface material may be deposited in a separated module.

A second station may then be used to deposit the dielectric barrier layer, e.g., by a pulsed process at the second station. Thus, the process gases are introduced to the surface of the semiconductor substrate, at the second station, using an individual gas supply system that creates a localized atmosphere at the substrate surface. In some embodiments, all four stations may be used to deposit the dielectric barrier layer.

Deposition of a dielectric bulk layer by CVD may be performed in one or more stations. Two or more stations may be used to perform CVD in a parallel processing. Alternatively a substrate may be indexed to have the CVD operations performed over two or more stations sequentially.

Figure 12:
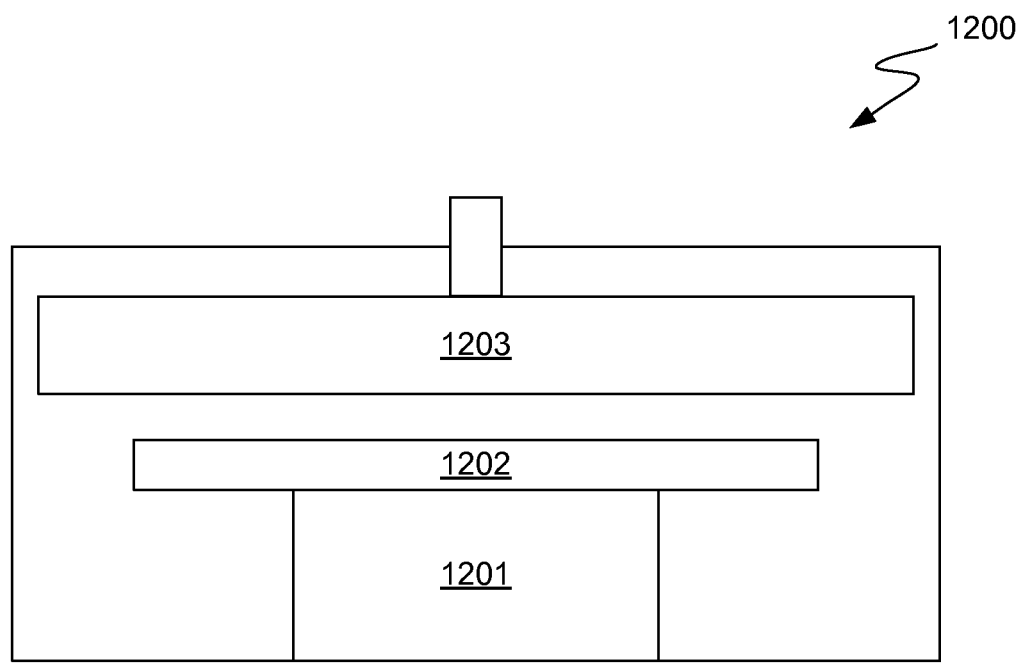
FIG. 12 is a schematic illustration of a chamber suitable for performing operations in accordance with disclosed embodiments.

An example of a deposition station 1200 is depicted in FIG. 12, including substrate support 1202 and showerhead 1203. A heater may be provided in pedestal portion 1201. Each deposition station includes a heated substrate support and a showerhead, dispersion plate or other gas inlet. In some embodiments, the deposition station 1200 may include a plasma generator such as a radio frequency (RF) plasma.

Figure 13:
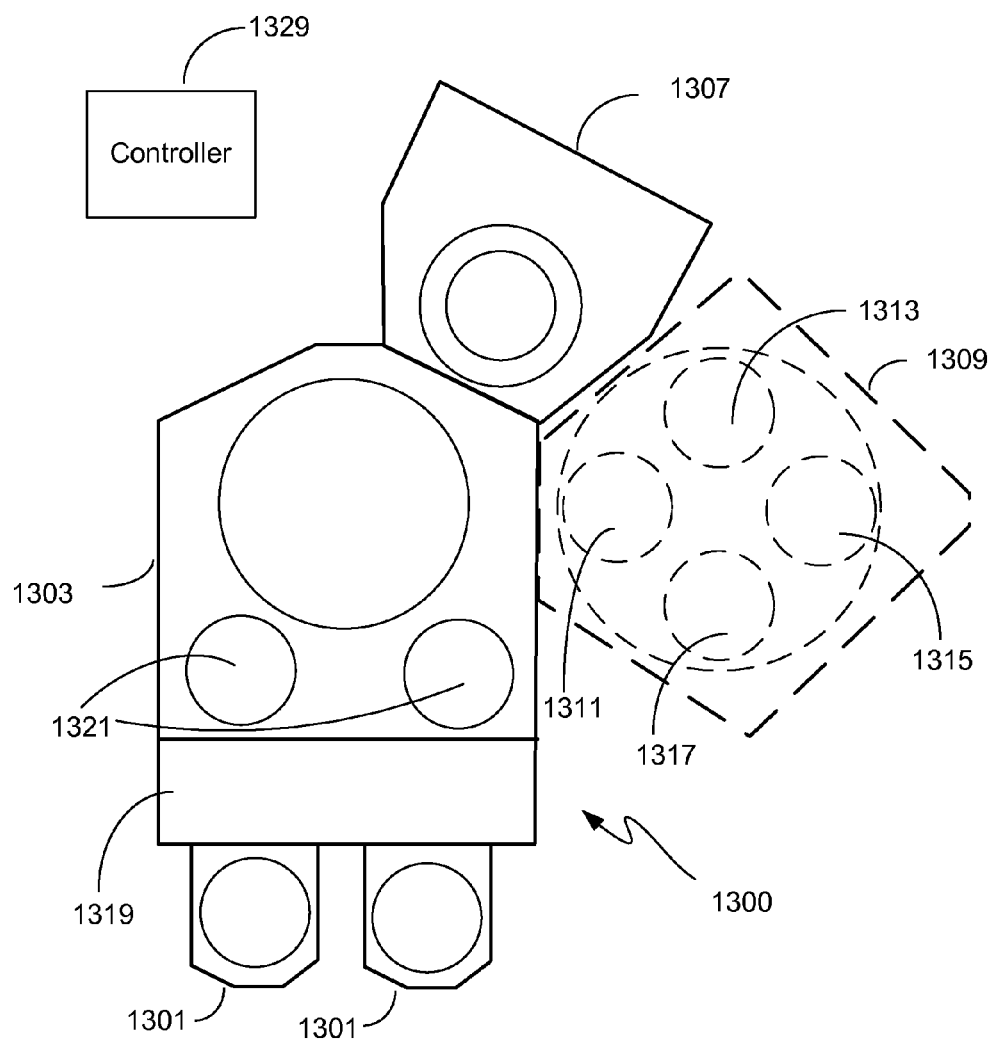
FIG. 13 is a schematic illustration of a tool suitable for performing operations in accordance with disclosed embodiments.

FIG. 13 is a block diagram of a processing system suitable for conducting copper-dielectric interface material and dielectric barrier layer deposition processes. The system 1300 includes a transfer module 1303. The transfer module 1303 provides a clean, pressurized environment to minimize the risk of contamination of substrates being processed as they are moved between the various reactor modules. Mounted on the transfer module 1303 is a multi-station reactor 1309 capable of performing substrate treatment, CVD deposition, and CFD deposition. Chamber 1309 may include multiple stations 1311, 1313, 1315, and 1317 that may sequentially perform these operations. For example, chamber 1309 could be configured such that station 1311 performs treatment, station 1313 performs CVD deposition of a copper-dielectric interface material, station 1315 performs CFD deposition of a dielectric barrier layer, and station 1317 performs CVD deposition of a dielectric bulk layer.

Also mounted on the transfer module 1303 may be one or more single or multi-station modules 1307 capable of performing plasma or chemical (non-plasma) pre-cleans. The module may also be used for various other operations, e.g., deposition of a copper-dielectric interface material layer. The system 1300 also includes one or more (in this case two) substrate source modules 1301 where substrates are stored before and after processing. An atmospheric robot (not shown) in the atmospheric transfer chamber 1319 first removes substrates from the source modules 1301 to loadlocks 1321. A substrate transfer device (generally a robot arm unit) in the transfer module 1303 moves the substrates from loadlocks 1321 to and among the modules mounted on the transfer module 1303. In some embodiments, the copper-dielectric interface material may be deposited in module 1307.

In various embodiments, a system controller 1329 is employed to control process conditions during deposition. The controller 1329 will typically include one or more memory devices and one or more processors. A processor may include a CPU or computer, analog, and/or digital input/output connections, stepper motor controller boards, etc.

The controller 1329 may control all of the activities of the deposition apparatus. The system controller 1329 executes system control software, including sets of instructions for controlling the timing, mixture of gases, chamber pressure, chamber temperature, substrate temperature, radio frequency (RF) power levels if applicable, substrate chuck or support position, and other parameters of a particular process. Other computer programs stored on memory devices associated with the controller 1329 may be employed in some embodiments. Alternatively, the control logic may be hard coded in the controller. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place.

A user interface may be associated with the controller 1329. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the glue layer precursor flows, carrier gas flow, and dielectric layer precursor flows, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface.

Signals for monitoring the process may be provided by analog and/or digital input connections of the system controller 1329. The signals for controlling the process are output on the analog and digital output connections of the deposition apparatus 1300.

The system software may be designed or configured in many different ways. For example, various chamber component subroutines or control objects may be written to control operation of the chamber components necessary to carry out the deposition processes in accordance with the disclosed embodiments. Examples of programs or sections of programs for this purpose include substrate positioning code, process gas control code, pressure control code, and heater control code.

A substrate positioning program may include program code for controlling chamber components that are used to load the substrate onto a pedestal or chuck and to control the spacing between the substrate and other parts of the chamber such as a gas inlet and/or target.

A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the substrate chuck. A plasma control program may include code for setting RF power levels and exposure times in one or more process stations in accordance with the embodiments herein.

Examples of chamber sensors that may be monitored during deposition include mass flow controllers, pressure sensors such as manometers, and thermocouples located in the pedestal or chuck. Appropriately programmed feedback and control algorithms may be used with data from these sensors to maintain desired process conditions.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically comprises some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a substrate stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of processing a semiconductor substrate, the method comprising:

performing subtractive etching by plasma-based dry etch on a blanket copper layer on the semiconductor substrate to form a plurality of patterned copper features spaced apart from each other, wherein each of the patterned copper features have a copper surface;

treating the patterned copper features to reduce the copper surfaces;

after reducing the copper surfaces, and prior to depositing a bulk dielectric layer over the substrate, selectively depositing a copper-dielectric interface material on the patterned copper features relative to non-copper material on the semiconductor substrate;

the non-copper material selected from the group consisting of tantalum, tantalum nitride, silicon nitride, carbon-doped silicon nitride, oxygen-doped silicon nitride, oxygen-doped silicon carbide, and combinations thereof; and depositing the dielectric layer over the patterned copper features to fill said space between the patterned copper features.

2. The method of claim 1, further comprising exposing the patterned copper features to UV light.

3. The method of claim 1, further comprising depositing a dielectric barrier layer over the patterned copper features prior to depositing the bulk dielectric layer and anisotropically etching the dielectric barrier layer to remove horizontal surfaces of the dielectric barrier layer deposited on the substrate, wherein the dielectric barrier layer is deposited conformally over the patterned copper features.

4. The method of claim 1, wherein the patterned copper features are treated for a time between about 1 second and about 300 seconds.

5. The method of claim 1, further comprising, prior to performing subtractive etching, depositing one or more underlayers on the substrate, wherein the blanket copper layer is deposited on the one or more underlayers.

6. The method of claim 5, wherein one of the one or more underlayers comprises tantalum and/or tantalum nitride.

7. The method of claim 1, wherein depositing the blanket copper layer forms grains having a size on average greater than a dimension of the patterned copper features formed by the subtractive etching.

8. The method of claim 1, wherein the copper-dielectric interface material is cobalt deposited by chemical vapor deposition.

9. The method of claim 1, wherein the adhesion energy of the copper-dielectric interface material to copper is at least about 5 J/m$^2$.

10. The method of claim 1, wherein the copper-dielectric interface material is deposited to a thickness less than about 30 Å.

11. The method of claim 1, wherein the patterned copper features have aspect ratios between about 5:1 and about 1:1.

12. The method of claim 1, wherein performing the subtractive etching to form the patterned copper features having the copper surfaces comprises:

depositing the blanket copper layer over the semiconductor substrate, and patterning the blanket copper layer to form the patterned copper features having the copper surface by removing regions of the blanket copper layer to form the patterned copper features.

13. The method of claim 1, further comprising, depositing a dielectric barrier layer.

14. The method of claim 13, wherein the dielectric barrier layer comprises a high-k material, and wherein k is greater than or equal to 3.

15. The method of claim 13, wherein the dielectric barrier layer is deposited to a thickness less than about 3 nm.

16. The method of claim 13, further comprising etching the dielectric layer to form at least one dielectric spacer, wherein the at least one dielectric spacer comprises material selected from the group consisting of aluminum oxide, SiOC, SiNC, and silicon oxide.

17. The method of claim 1, wherein depositing the bulk dielectric layer leaves air gaps.

* * * * *